(12) United States Patent
McCauley et al.

(10) Patent No.: US 6,771,078 B1
(45) Date of Patent: Aug. 3, 2004

(54) APPARATUS AND METHOD FOR FAULT DETECTION ON CONDUCTORS

(75) Inventors: Simon Francis McCauley, Newcastle (AU); David Keith Sweeting, St. Ives (AU)

(73) Assignee: CHK Wireless Technologies Australia Pty. Ltd. (AU)

( * ) Notice: Subject to any disclaimer, the term of this patent is extended or adjusted under 35 U.S.C. 154(b) by 0 days.

(21) Appl. No.: 09/958,631

(22) PCT Filed: Apr. 12, 2000

(86) PCT No.: PCT/AU00/00314

§ 371 (c)(1),
(2), (4) Date: Jan. 18, 2002

(87) PCT Pub. No.: WO00/62083

PCT Pub. Date: Oct. 19, 2000

Related U.S. Application Data (60) Provisional application No. 60/128,746, filed on Apr. 12, 1999.

(51) Int. Cl.[7] .............................................. H01H 31/02
(52) U.S. Cl. ...................................... 324/539; 324/538
(58) Field of Search ............................... 324/538, 539, 324/117 H, 529; 361/42

(56) References Cited

U.S. PATENT DOCUMENTS

| | | | |
|---|---|---|---|
| 4,408,155 A | | 10/1983 | McBride |
| 4,539,520 A | * | 9/1985 | McBride .................. 324/117 H |
| 5,250,894 A | * | 10/1993 | Bridges et al. .......... 324/117 H |
| 6,230,109 B1 | * | 5/2001 | Miskimins et al. .......... 702/109 |
| 6,558,397 B2 | * | 5/2003 | Hirt et al. ..................... 361/42 |

FOREIGN PATENT DOCUMENTS

| | | | | |
|---|---|---|---|---|
| DE | 3119 925 | | 12/1982 | |
| GB | 2 140 564 A | * | 5/1983 | .......... G01N/27/22 |
| GB | 2 140 564 | | 11/1984 | |
| WO | WO 89/09411 | | 10/1989 | |

OTHER PUBLICATIONS

Craddock et al., "The design and application of a permanent fault–passage indicator," Int. Conf. on Lightning and Power Systems, Jun. 5–7, 1984, pp 188–192, IEE, London and New York.

* cited by examiner

*Primary Examiner*—N. Le
*Assistant Examiner*—Walter Benson
(74) *Attorney, Agent, or Firm*—Haugen Law Firm PLLP (57) ABSTRACT

A method of detecting for a fault on one of a plurality of adjacent, alternating current carrying conductors; the method comprising the steps of detecting the waveform of a first component of a magnetic field vector representative of the magnetic field around the plurality of conductors at a location along the conductors; detecting the waveform of a second component of the magnetic field vector; monitoring, at the location, the two waveforms for any change in the waveforms; and detecting for a fault on one of the plurality of the conductors as indicated by a change in either one or both of the waveforms.

8 Claims, 7 Drawing Sheets

FIG_1.

FIG_6

Figure 7

APPARATUS AND METHOD FOR FAULT DETECTION ON CONDUCTORS

This application is the National Stage of International Application No. PCT/AU00/00314 filed Apr. 12, 2000 and published in English under PCT Article 21(2), which claims the benefit of U.S. Provisional Application No. 60/128,746 filed Apr. 12, 1999.

FIELD OF THE INVENTION

This invention relates broadly to a method and an apparatus for detecting faults on any one of a plurality of adjacent conductors utilising magnetic field measurements. The invention will be described herein with reference to fault indicators for overland power distribution cables, it will be appreciated, however, that the invention does have broader applications for various conductor arrangements in which faults may be experienced.

BACKGROUND OF THE INVENTION

Equipment for detection and location of faults on a plurality of overland power distribution cables involves typically the measurement of the magnetic field produced by the alternating currents flowing in the cables, using a single magnetic field sensing coil. Such equipment derives a signal indicative of the average magnetic field, and this is used for the detection and location of faults. When one or more of the cables experience a fault, high currents flow in the cables, producing a rapid increase in the magnetic fiend around the cables. Therefore, if an increase is detected by the equipment, this is indicative of a fault current in one or more of the cables having passed the magnetic field sensing coil.

However, the applicant has found that the use of a single coil has the disadvantage that there is usually at least one set of fault currents for a given cable configuration that will produce a change in the magnetic field around the cables that is not detectable by the single coil. This is because a single coil measurement cannot be utilised to monitor changes in the magnetic field that vary the relevant magnetic field vector at the point of the measurements in a direction perpendicular to the central axis of the coil.

SUMMARY OF THE INVENTION

In accordance with a first aspect of the present invention there is provided a method of detecting for a fault on one of a plurality of adjacent, alternating current carrying conductors; the method comprising the steps of detecting the waveform of a first component of a magnetic field vector representative of the magnetic field around the plurality of conductors at a location along the conductors, detecting the waveform of a second ( i.e., angularly displaced) component of the magnetic field vector; monitoring, at the location, the two waveforms over a continuous time interval for any changes in the waveforms; and detecting for a fault on one of the plurality of the conductors as indicated by a change over the continuous time interval in either one or both of the waveforms.

Preferably, the method further comprises the step of determining whether the fault experienced is a phase to phase or a phase to earth fault as indicated by a change in both waveforms.

In one embodiment, the first and second components are at 90° with respect to each other.

Advantageously, the first component is the horizontal component of the magnetic field vector and the second component is the vertical component of the magnetic field vector.

In one embodiment, the step of monitoring the two waveforms comprises the steps of monitoring a first amplitude of the first waveform over a period of the alternating current, and monitoring a second amplitude of the second waveform over the period, and the step of detecting for a fault comprises detecting for the fault as indicated by a change in either one or both of the amplitudes.

Preferably, the step of monitoring the two waveforms comprises the step of monitoring a phase difference between the first and second waveforms, and the step of detecting for a fault comprises detecting for the fault as indicated by a change in the phase difference.

In accordance with a second aspect of the present invention there is provided an apparatus for detecting for a fault on one of a plurality of adjacent, alternating current carrying conductors, the apparatus comprising first detecting means for detecting the waveform of a first component of a magnetic field vector representing the magnetic field around the plurality of conductors at a location along the conductors; second detecting means for detecting the waveform of a second (i.e., angularly displaced) component of the magnetic field vector; monitoring means for monitoring the two waveforms over a continuous time interval for any changes in the waveforms; and a detecting unit arranged to generate a fault indication signal depending on a change over the continuous time interval in either one or both of the waveforms.

Preferably, the detecting unit is further arranged to determine whether the fault experienced is a phase to phase or phase to earth fault depending on reference data stored in a database of the apparatus.

In one embodiment, the monitoring unit is arranged to monitor a first amplitude of the first waveform over a period of the alternating current, and to monitor a second amplitude of the second waveform over the period, and the detecting unit generates a fault indication signal depending on a change in either one or both of the amplitudes.

Preferably, the monitor unit is further arranged to monitor a phase difference between the first and second waveforms and the detecting unit is further arranged to generate the fault indication signal depending on changes in the phase difference.

The present invention may be more readily understood from the description of preferred forms of an apparatus for electrical measurements on conductors given below with reference to the accompanying drawings.

DETAILED DESCRIPTION OF THE PREFERRED EMBODIMENT

Figure 1:
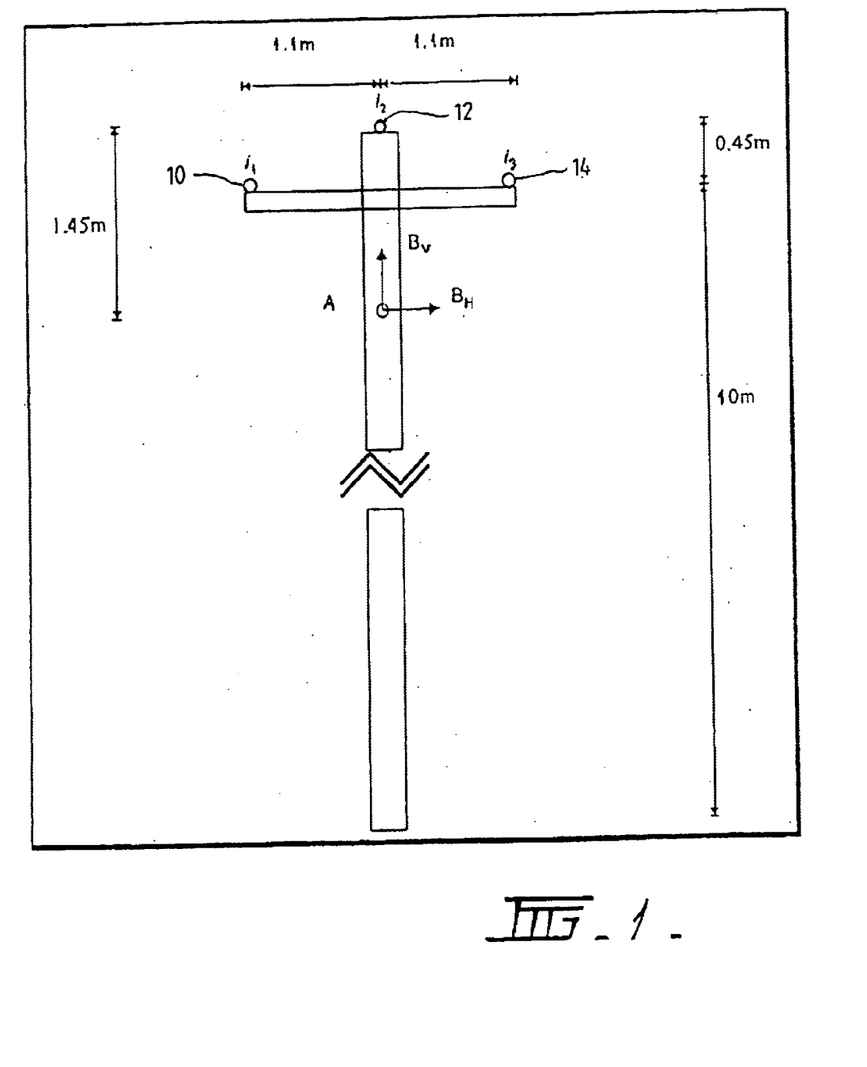
FIG. 1 is a schematic diagram illustrating a set of three conductors mounted on a pole. The earth acts as a fourth conductor during earth faults.

In FIG. 1, the conductors 10, 12 and 14 carry currents $i_1$, $i_2$ and $i_3$, and the earth carries any imbalance. The magnetic field vector at a point A on the pole has horizontal and vertical components $B_H$ and $B_V$.

At point A, the magnetic field vector follows an elliptical shape over the period of the sinewave. The shape of the ellipse varies depending on the amplitudes and phases of the currents $i_1$, $i_2$ and $i_3$.

The ellipse of magnetic fields produced by four sets of currents is shown in FIGS. 2 to 5.

Figure 2:
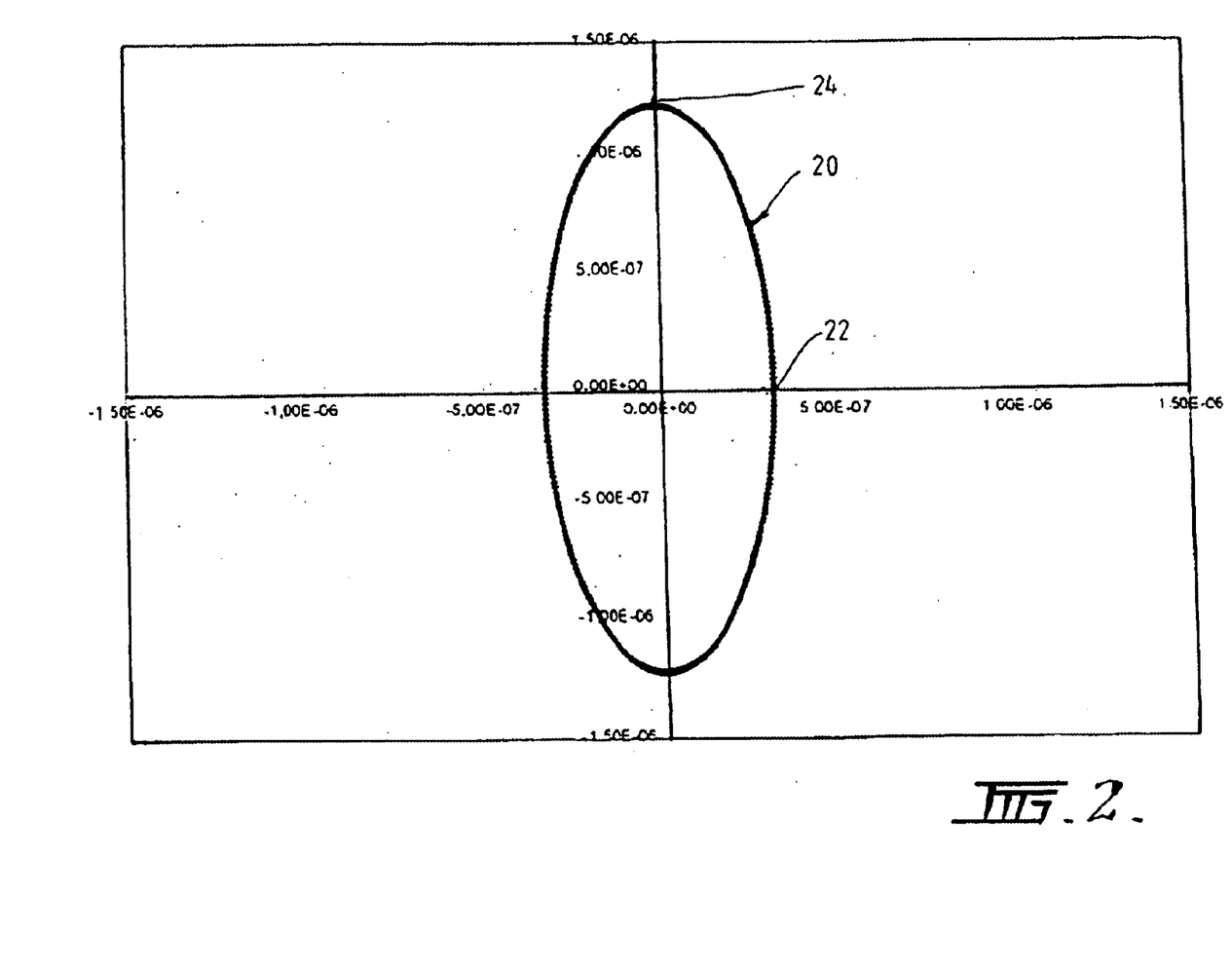
FIG. 2 is a graph illustrating the changes of a magnetic field vector produced at point A of FIG. 1 for a balanced three phase set of currents flowing in the conductors.

Turning to FIG. 2, the graph 20 shows the ellipse of magnetic fields produced by a balanced set of three phase magnetic fields produced by a balanced set of three phase currents, with amplitude equal to 5 ampere:

$$i_1=5\cos(wt)\ i_2=5\cos(wt-2\pi/3)\ i_3=5\cos(wt-4\pi/3)$$

$$B_{xmax},\ 22=0.33\ \mu T,\ B_{ymax},\ 24=1.22\ \mu T$$

Figure 3:
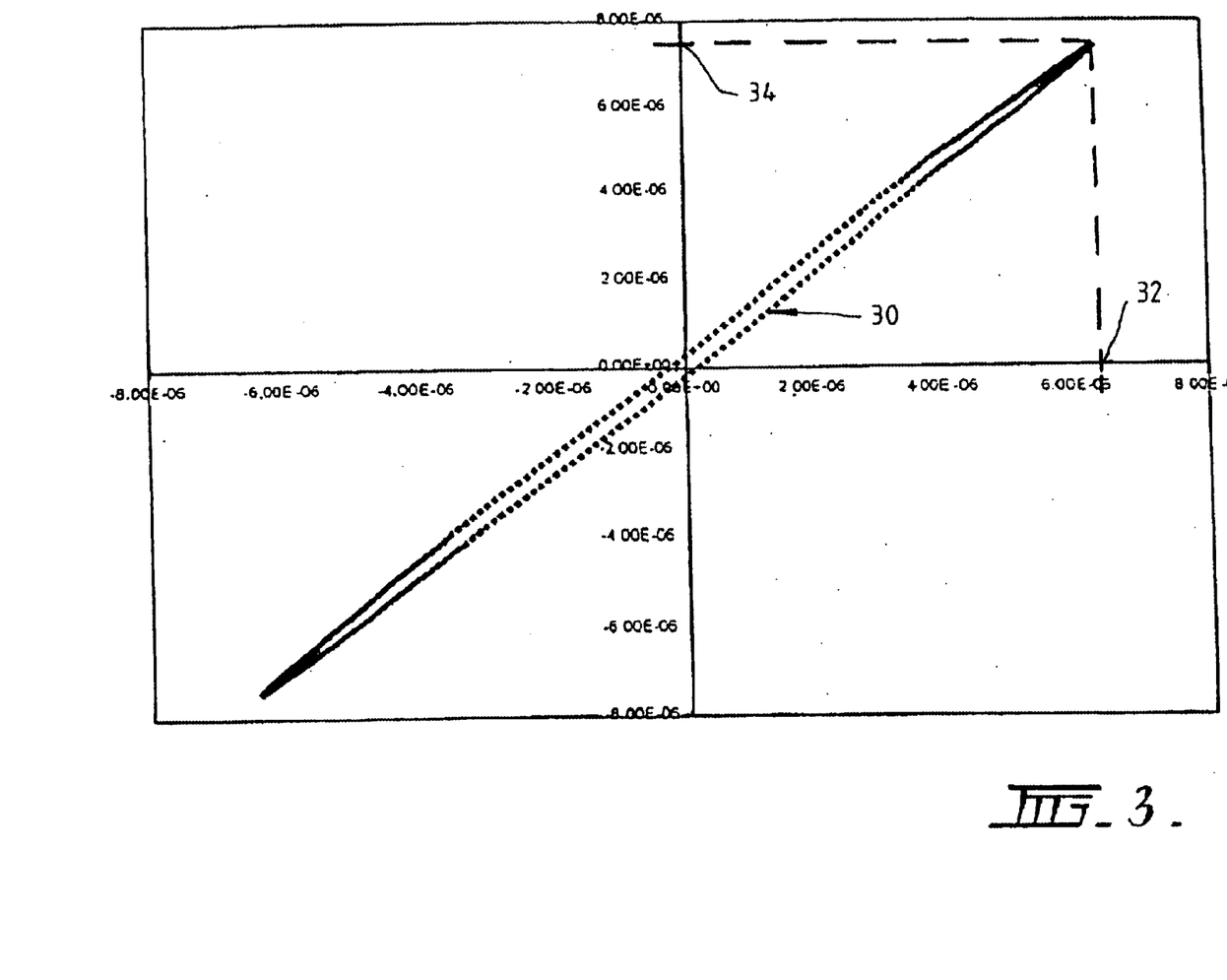
FIG. 3 is a graph illustrating the changes in the magnetic field vector for a 50 ampere earth fault on phase 1 of the set of currents of FIG. 2.

In FIG. 3, the graph 30 shows a phase to earth fault on phase 1. Compared to graph 20 of FIG. 2, the peak horizontal and vertical magnetic fields 32 and 34 respectively have increased as shown below:

$$i_1=51.67\cos(wt)\ i_2=4.41\cos(wt+101°)\ i_3=4.41\cos(wt-101°)$$

$$B_{xmax}=6.35\ \mu T,\ B_{ymax}=7.42\ \mu T$$

|  | Pre-fault | Fault | Fault: pre-fault ratio |
|---|---|---|---|
| $B_{xmax}$, 32 | 0.33 $\mu T$ | 6.35 $\mu T$ | 19.2 |
| $B_{ymax}$, 34 | 1.22 $\mu T$ | 7.42 $\mu T$ | 6.08 |

Figure 4:
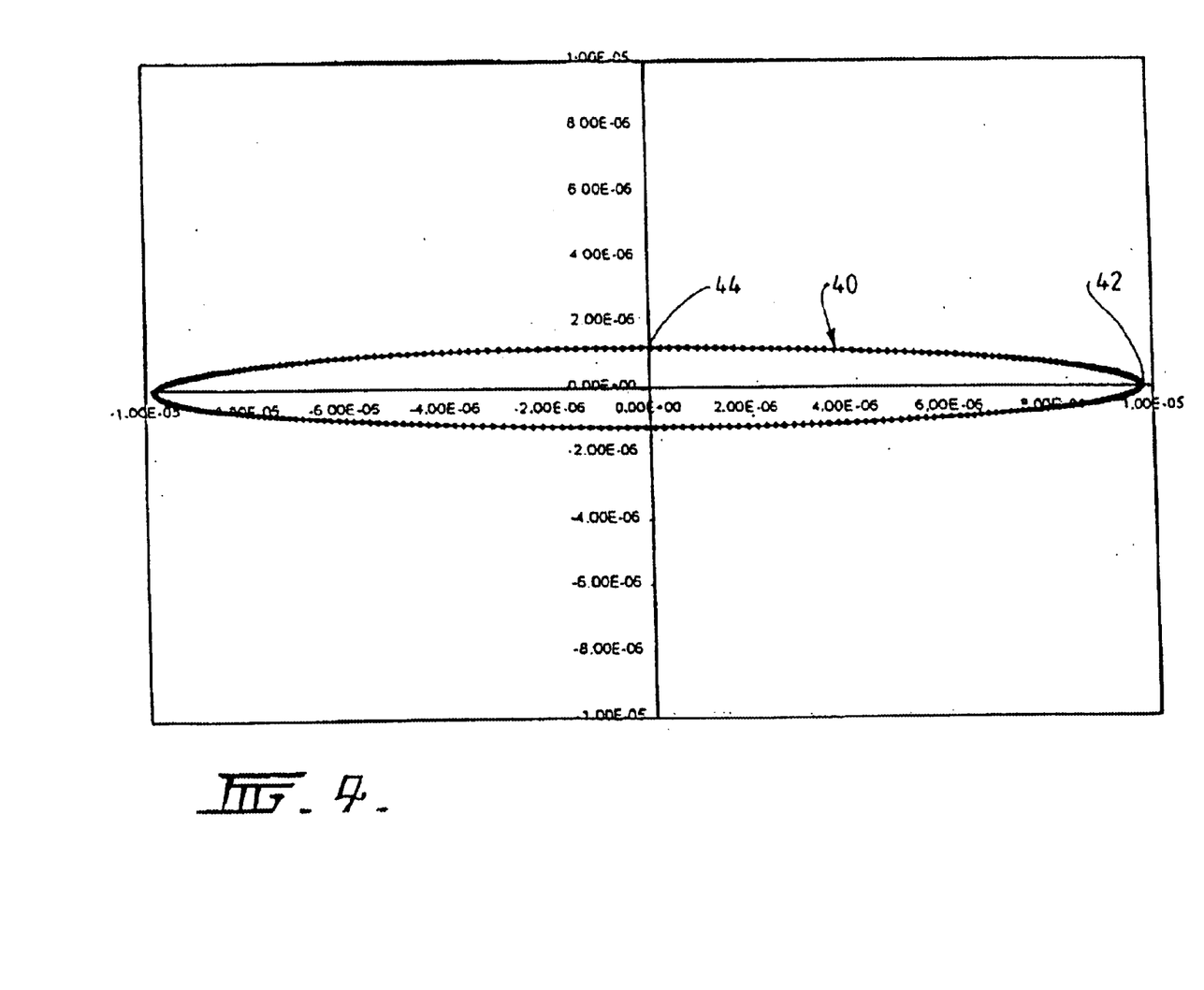
FIG. 4 is a graph illustrating the changes of the magnetic field vector for a 50 ampere earth fault on phase 2 of the set of currents of FIG. 2.

Turning now to FIG. 4, the graph 40 shows a phase to earth fault on phase 2. Compared to graph 30 of FIG. 2, the peak horizontal magnetic field 42 has increased but the peak vertical magnetic field 44 has not changed. If one was only measuring the vertical magnetic field, the fault current would not be detected:

$$i_1=4.41\cos(wt+19.1°)\ i_2=51.67\cos(wt-2\pi/3)$$

$$i_3=4.41\cos(wt-139.1°)$$

$$B_{xmax}=9.80\ \mu T,\ B_{ymax}=1.22\ \mu T$$

|  | Pre-fault | Fault | Fault: pre-fault ratio |
|---|---|---|---|
| $B_{xmax}$, 42 | 0.33 $\mu T$ | 9.80 $\mu T$ | 29.7 |
| $B_{ymax}$, 44 | 1.22 $\mu T$ | 1.22 $\mu T$ | 1.0 |

Figure 5:
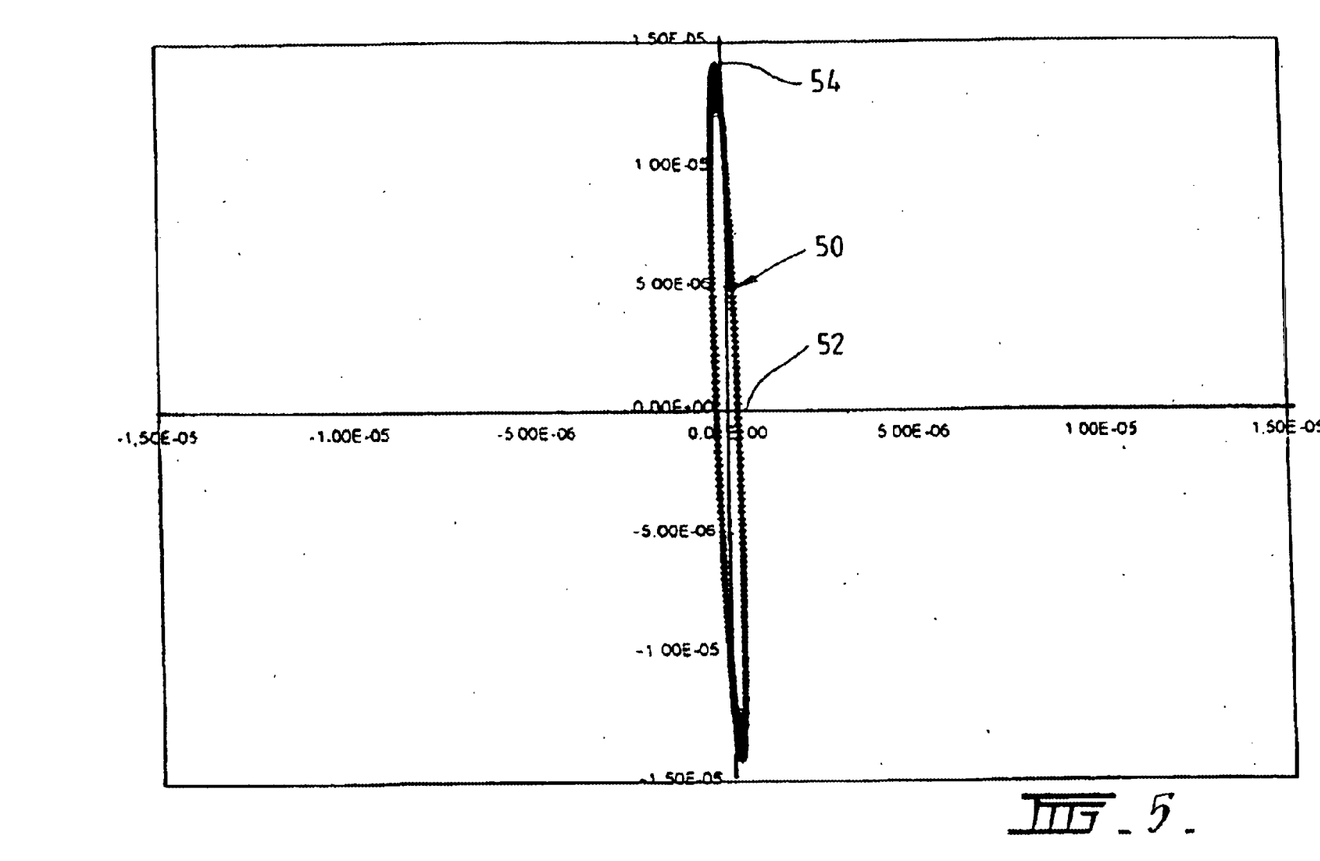
FIG. 5 is a graph illustrating the changes in the magnetic field vector for a 50 ampere phase to phase fault on phases 1 and 3 of the set of currents of FIG. 2.

Turning now to FIG. 5, the graph 50 shows a phase to phase fault on phases 1 and 3. Compared to graph 30 of FIG. 2, the peak vertical magnetic field 54 has increased but the peak horizontal magnetic field 52 has not changed. If only the horizontal magnetic field is measured, the fault current would not be detected:

$$i_1=50\cos(wt)+2.5\cos(wt+300°)\ i_2=5\cos(wt-2\pi/3)$$

$$i_3=50\cos(wt-\pi)+2.5\cos(wt+300°)$$

$$B_{xmax}=0.33\ \mu T,\ B_{ymax}=14.08\ \mu T$$

|  | Pre-fault | Fault | Fault: pre-fault ratio |
|---|---|---|---|
| $B_{xmax}$, 52 | 0.33 $\mu T$ | 0.33 $\mu T$ | 1.0 |
| $B_{ymax}$, 54 | 1.22 $\mu T$ | 14.08 $\mu T$ | 11.54 |

FIGS. 4 and 5 illustrate the limitations of only measuring one of the horizontal or vertical components of the magnetic field vector.

Use of a single coil at a fixed angle to the horizontal shows similar limitations. This is because there is usually at least one set of fault currents (for one of the conductor configurations in general use) that will produce a change in magnetic field that will not be detectable by the single coil.

A possible solution is to mount the magnetic field sensing point A away from the axis of the middle conductor. This is troublesome in practice, requiring special mounting equipment and calculation of the optimum position for each conductor configuration.

The measurement of both vertical and horizontal magnetic fields removes the limitations found above, and decreases the possibility of missing the passage of fault current.

Figure 6:
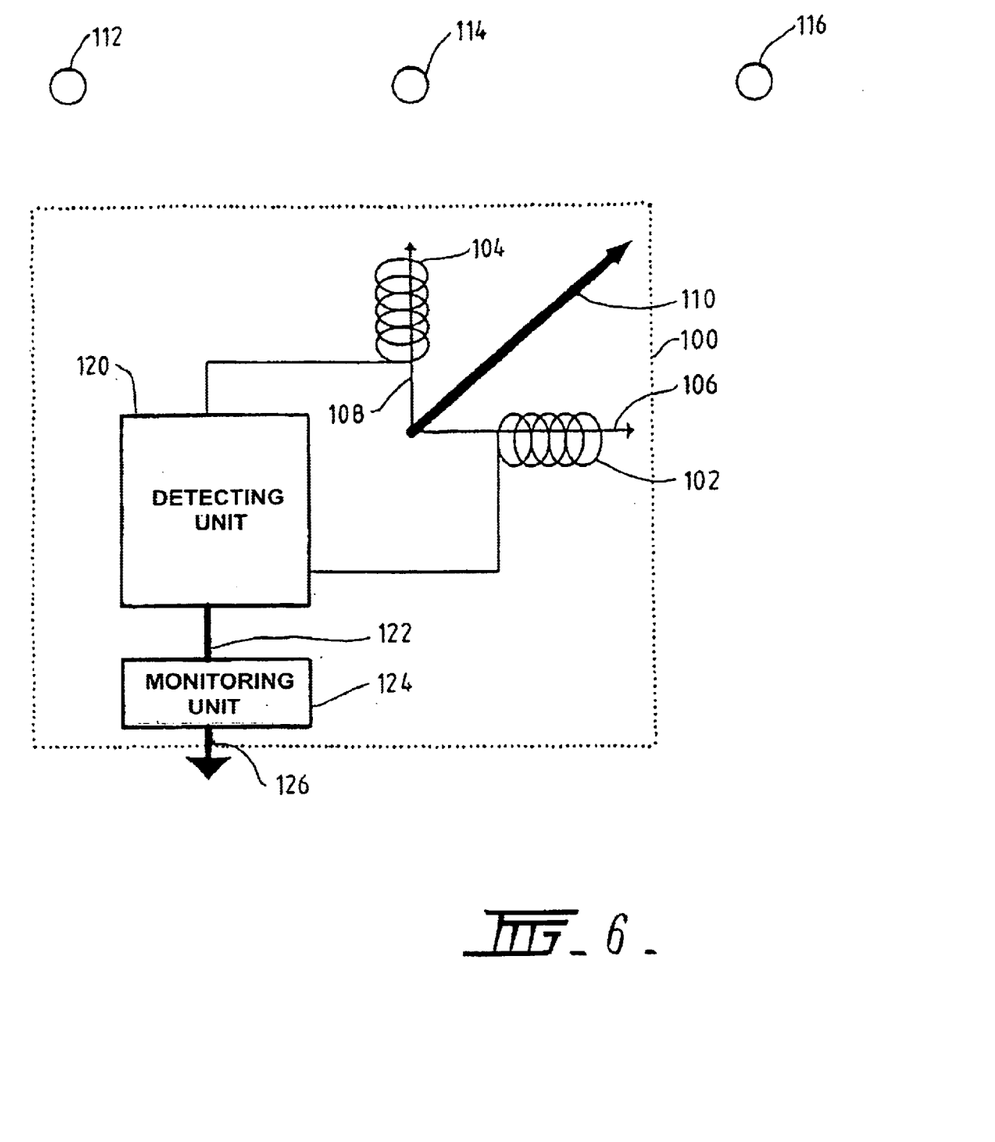
FIG. 6 is a schematic diagram illustrating the use of an apparatus for detecting faults on a plurality of conductors in accordance with one embodiment of the present invention.
Figure 7:
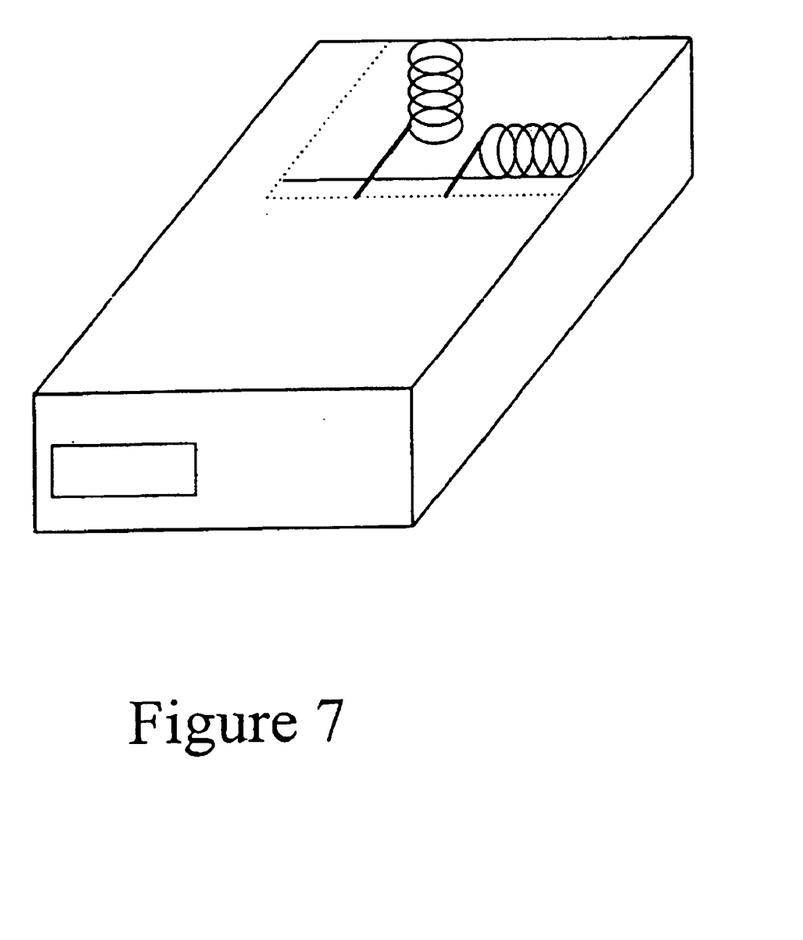
FIG. 7 is a perspective view of the apparatus in FIG. 6.

Turning now to FIG. 6, a device 100 embodying the present invention comprises two coils 102 and 104 to measure the horizontal and vertical components 106, 108 respectively of a magnetic field vector 110 indicative of the magnetic field around an arrangement of three conductors 112, 114 and 116 at a location along the conductors.

The device 100 further comprises a detecting unit 120 for detecting analogue voltage signals derived from the coils 102, 104. The detecting unit 120 generates signals 122 indicative of the waveforms of the components 106 and 108 respectively.

In the monitoring unit 124, a fault detection signal 126 can be generated depending on changes in the waveforms.

Changes in the waveforms can be indicative of the occurrence of faults on one or more of the conductors 110, 114 and 116, as illustrated in the example scenarios of FIGS. 2 to 5. For example changes in the parameters measured for the waveforms of the components 106 and 108, such as e.g. their amplitudes, phase difference, harmonic content etc., over a period of the alternating current in the conductors 110, 114, and 116 may be utilised. Alternatively, the waveforms of the components 106 and 108 may be compared with reference data stored in a database (not shown).

The embodiment described above utilises two coils to measure the horizontal and vertical components of the magnetic field vector. The direction of the component measured is determined by the central axis of the coils. It will be appreciated by a person skilled in the art that the present invention is not limited to the measurement of the horizontal and vertical components, but rather any two components may be measured, provided that the components are angularly displaced. It is advantageous that the angle between the components is 90°.

It will also be appreciated by a person skilled in the art that the present invention is not limited to the use of two coils for measuring the respective components of the magnetic field vector. The measurements may be performed utilising a movable coil which can be angularly displaced to perform sequences of measurements for the respective components.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

In the claims that follow and in the summary of the invention, except where the context requires otherwise due to express language or necessary implication, the word "comprising" is used in the sense of "including", i.e. the features specified may be associated with further features in various embodiments of the invention.

What is claimed is:

1. A method of detecting for a fault on one of a plurality of adjacent, alternating current carrying conductors; the method comprising the steps of:
   detecting the waveform of a first component of a magnetic field vector representative of the magnetic field around the plurality of conductors at a location along the conductors;
   detecting the waveform of a second component of the magnetic field vector;
   monitoring a first amplitude of the first waveform over a period of the alternating current;
   monitoring a second amplitude of the second waveform of the second component over the period; and
   detecting for a fault on one of the plurality of the conductors as indicated by a change in either one or both of the amplitudes.

2. A method as claimed in claim 1, further comprising the step of determining whether the fault experienced is a phase to phase or a phase to earth fault as indicated by the change in either one or both of the waveforms.

3. A method as claimed in claim 1, wherein the first and second components are at 90° with respect to each other.

4. A method as claimed in claim 1, wherein the first component is the horizontal component of the magnetic field vector and the second component is the vertical component of the magnetic field vector.

5. A method as claimed in claim 1, wherein the step of monitoring the two waveforms comprises the step of monitoring a phase difference, between the first and the second waveforms, and the step of detecting for a fault comprises detecting for the fault as indicated by a change in the phase difference.

6. An apparatus for detecting for a fault on one of a plurality of adjacent, alternating current carrying conductors, the apparatus comprising
   a first detecting means for detecting the waveform of a first component of a magnetic field vector representing the magnetic field around the plurality of conductors at a location along the conductors;
   second detecting means for detecting the waveform of a second component of the magnetic field vector;
   monitoring means for monitoring the two waveforms for any change in the waveforms, the monitoring means being arranged to monitor a first amplitude of the first waveform over a period of the alternating current and to monitor a second amplitude of the second waveform over the period; and
   a detecting unit arranged to generate a fault indication signal depending on a change in either one or both of the amplitudes.

7. An apparatus as claimed in claim 6, wherein the detecting unit is further arranged to determine whether the fault experienced is a phase to phase or phase to earth fault depending on reference data stored in a database of the apparatus.

8. An apparatus as claimed in claim 6, wherein the monitoring unit is further arranged to monitor a phase difference between the first and second waveforms, and the detecting unit is arranged to generate the fault indication signal depending on the phase difference.

* * * * *